United States Patent [19]
Lee

[11] Patent Number: 5,323,436
[45] Date of Patent: Jun. 21, 1994

[54] APPARATUS OF AND METHOD FOR COUNTING A NUMBER OF REVOLUTIONS OF A SERVO MOTOR

[75] Inventor: Jim-Won Lee, Seoul, Rep. of Korea

[73] Assignee: Samsung Electronics, Co., Ltd., Suwon-shi, Rep. of Korea

[21] Appl. No.: 977,218

[22] Filed: Nov. 16, 1992

[30] Foreign Application Priority Data

Nov. 18, 1991 [KR] Rep. of Korea ............. 91-20530

[51] Int. Cl.$^5$ .................. G06M 1/27; G01R 29/20
[52] U.S. Cl. ............................. 377/17; 377/20; 377/45; 307/515; 324/207.25
[58] Field of Search .................... 377/17, 20, 45; 307/515; 324/207.22, 207.25

[56] References Cited

U.S. PATENT DOCUMENTS

| | | | |
|---|---|---|---|
| 4,216,530 | 8/1980 | Yamaki et al. | 377/17 |
| 4,406,002 | 9/1983 | Wine | 369/220 |
| 4,575,865 | 3/1986 | Dackow | 307/515 |
| 4,881,248 | 11/1989 | Korechika | 377/17 |
| 5,004,981 | 4/1991 | Hashimoto et al. | 324/207.25 |
| 5,079,549 | 11/1992 | Liessner | 377/45 |

FOREIGN PATENT DOCUMENTS 0080321 5/1985 Japan .
0014617 1/1990 Japan .
0122520 5/1991 Japan .

Primary Examiner—John S. Heyman
Attorney, Agent, or Firm—Burns, Doane, Swecker & Mathis

[57] ABSTRACT

A revolution counting circuit for performing such an operation includes a pulse multiplying unit for multiplying signal pulses generated by an encoder and a pulse dividing unit for dividing the multiplied signal pulses by a divided value set up by a microprocessor. Further, a revolution counting circuit may include a pulse selection unit for selecting one of the signal pulses generated by the pulse multiplying unit and the pulse dividing unit. Also included are a waveform shaping unit for generating a pair of divided signal pulses having the same phase difference as the signal pulses generated by the encoder and a control signal generator for sending control signals to the waveform shaping unit.

6 Claims, 3 Drawing Sheets

FIG. 1
(PRIOR ART)
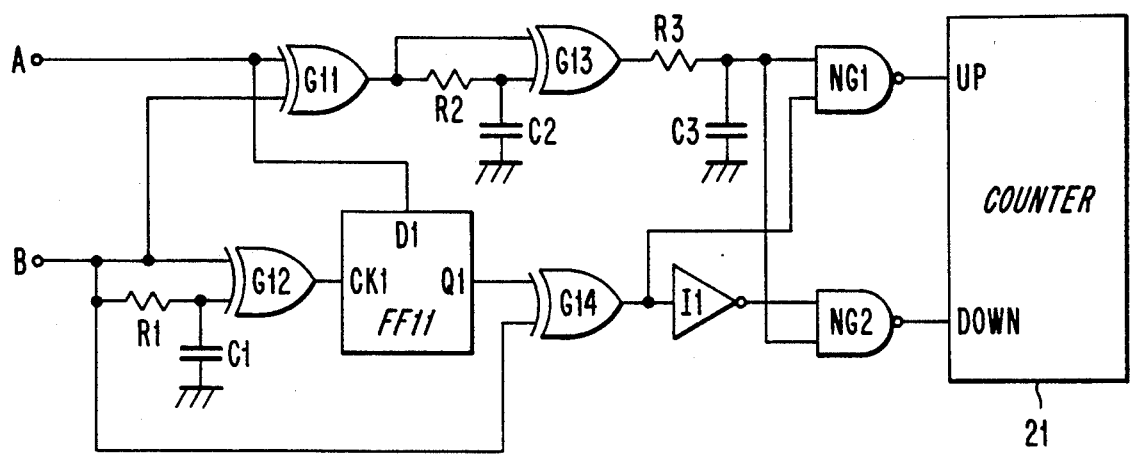
FIG. 2A (PRIOR ART)
FIG. 2B (PRIOR ART)
FIG. 2C (PRIOR ART)
FIG. 2D (PRIOR ART)
FIG. 2E (PRIOR ART)
FIG. 2F (PRIOR ART)
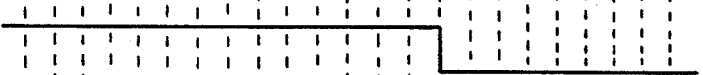
FIG. 2G (PRIOR ART)
FIG. 2H (PRIOR ART)
FIG. 2I (PRIOR ART)
FIG. 2J (PRIOR ART)
*FORWARD DIRECTION* — *REVERSE DIRECTION*

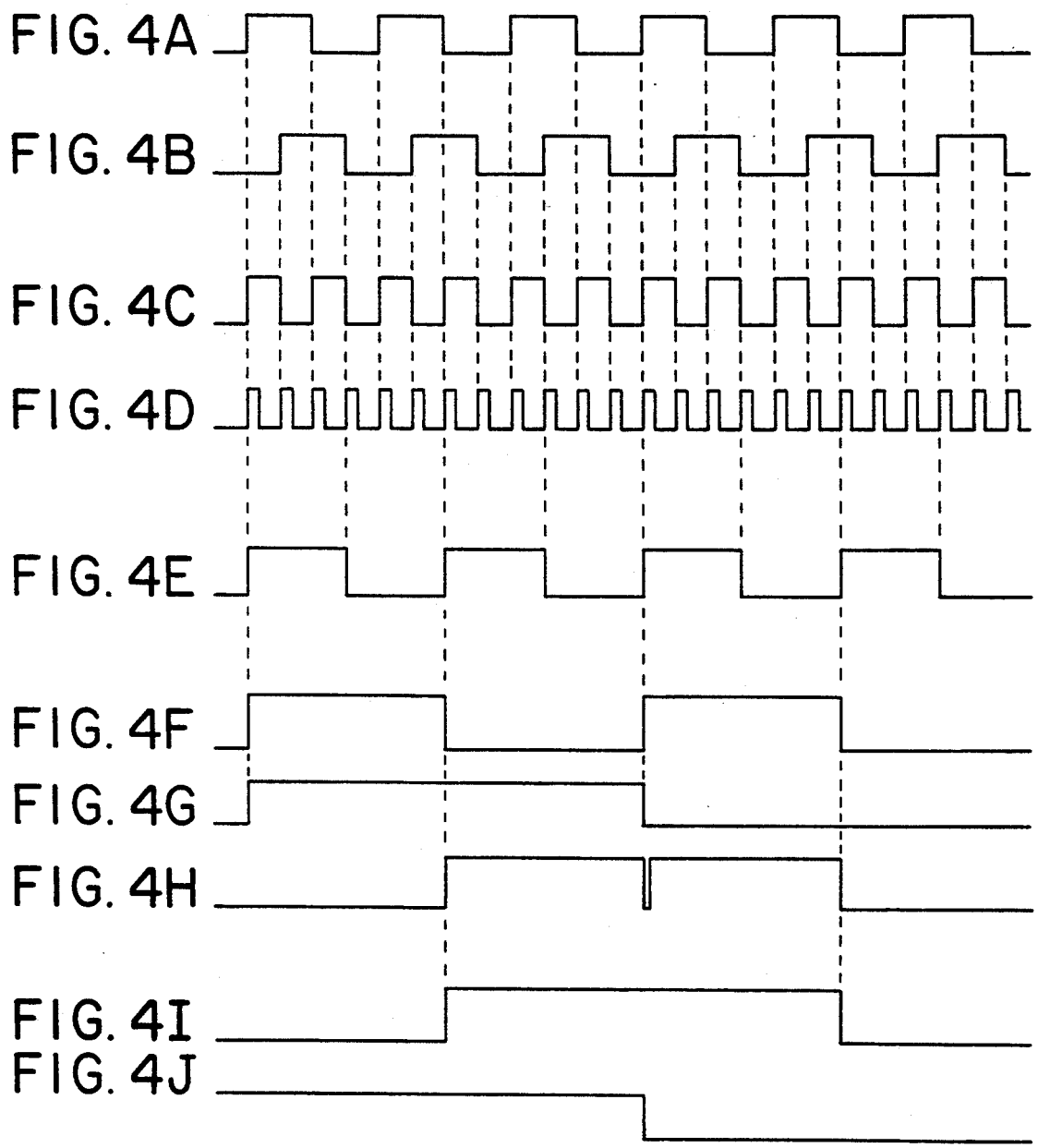

APPARATUS OF AND METHOD FOR COUNTING A NUMBER OF REVOLUTIONS OF A SERVO MOTOR

BACKGROUND OF THE INVENTION

1. Field of the Invention

The present invention relates to an apparatus for and method of counting a number of revolutions of a servo motor for detecting an amount of movement of a rotary arm of an articulation robot by counting a nynber of revolutions of a servo motor which drives the articulation robot and the like, and more particularly to an apparatus and method wherein a square pulse from an encoder attached to the servo motor can be divided by a pulse suitable for an operating frequency range of a position controller which controls said servo motor.

2. Description of the Prior Art

In a conventional counting circuit such as that illustrated in FIG. 1, a pulse input channel a is jointly connected to an first input terminal of an exclusive OR gate G11 and to an input terminal D1 of a flip flop FF11. A second input terminal of said exclusive OR gate G11 is connected to a pule input channel B. Square pulses denoting revolutions information concerning a servo motor are outputted from an encoder (not shown) to the pulse input channels A and B.

The pulse input channel B is also connected to a first input terminal of an exclusive OR gate G12 and simultaneously is connected to a second input terminal of the exclusive OR gate G12 through a resistor R1 and a capacitor C1. An output terminal of the exclusive OR gate G12 is connected to a clock irlput CK1 of said flip flop FF11.

An output terminal of the exclusive OR gate G11 is connected to a first input terminal of an exclusive OR gate G13. The output terminal is also connected to a second input terminal of said exclusive OR gate G12 through a resistor R2 and a capacitor C2. An output terminal of the exclusive OR gate G13 is connected through a resistor R3 and a capacitor C3 to a first input terminal of NAND gates NG1, NG2 wherefrom and output terminals are connected respectively to either an up-terminal or a down-terminal or a counter 21. A second input terminal of the NAND gate NG1 is connected to the output terminal of the exclusive OR gate G14. A first input terminal of the exclusive OR gate G14 is connected to an output terminal Q1 of said flip flop FF11 and a second input terminal of the exclusive OR gate G14 is connected to said pulse input channel B. The output terminal of exclusive OR gate G14 is connected to a second input terminal of said NAND gate NG2 through an inverter 11.

In the conventional counting circuit as described in the foregoing, square pulses depicted in FIG. 2A are supplied to the first input terminal of the exclusive OR gate G11 through the pulse input channel A depicted in FIG. 1 in accordance with forward or reverse rotations of a rotary shaft. The square pulses illustrated in FIG. 2B are supplied to the second input terminals of the exclusive OR gates G11 and G12 through the pulse input channel B and simultaneously are supplied to the second input terminal of said exclusive OR gate G12 after a predetermined period of delay time when transferred through the resistor R1 and the capacitor C1.

Accordingly, the square pulses illustrated in FIG. 2C are supplied from the output side of exclusive OR gate G11 to a first input terminal of exclusive OR gate G13 and simultaneously are supplied to a second input terminal of the exclusive OR gate G13 after a predetermined period of delay time when transferred through the resistor R2 and the capacitor C2. The square pulses as depicted in FIG. 2D are outputted from an output terminal of the exclusive OR gate G13 and the outputted square pulses are supplied to the first input terminal of NAND gates NG1 and NG2 through the resistor R3 and the capacitor C3 after a predetermined period of delay time.

The square pulses as illustrated in FIG. 2E outputted from an output terminal of the exclusive OR gate G12 are supplied to the clock input CK1 of the flip flop FF11. The pulses illustrate in FIG. 2F are outputted to an output terminal Q1 of the flip flop FF11, and are supplied to a first input terminal of the exclusive OR gate G14. The square pulses illustrated in FIG. 2B inputted to the pulse input channel B are supplied to a second input terminal of the exclusive OR gate G14.

Accordingly, a high level signal or a low level signal is outputted from an output terminal of the exclusive OR gate G14 in accordance with the rotation of the rotary shaft in the forward or reverse directions as illustrated in FIG. 2G. The resulting signal is supplied to the second input terminal of NAND gate NG1, and at the same time, is inverted to a low level signal or a high level signal through an inverter 11 as illustrated in FIG. 2H and supplied to the second input terminal of NAND gate NG2.

Consequently, square pulses as illustrated in FIG. 2I and FIG. 2J are outputted from the output terminals of NAND gates NG1 and NG2 and are supplied to Up and Down terminals of a counter 21. The counter 21 increases of decreases its pulse count by one in accordance with one revolution of the rotary shaft thereby counting that revolution of the rotary shaft.

In this kind of conventional counting circuit, as the rotary shaft performs one revolution, pulses being inputted into the pulse input channels A and B are multiplied four times, and the counter down-counts or up-counts the multiplied pulses to count the revolution of the rotary shaft. However, because a position controller (not shown) which controls a servo motor differs in rated frequency ranges according to the type employed, the conventional counting circuit, which counts the pulses outputted in accordance with one revolution of the rotary shaft only within an output frequency range corresponding to its predetermined range, can only use a position controller which operates within an output frequency range corresponding to its predetermined range. If the rated frequency range of the position controller is less than the output frequency of the counting circuit, a problem arises in that said conventional counting circuit can not be used.

SUMMARY OF THE INVENTION

In order to solve the afore-mentioned problem, according to the present invention, it is an object to provide a revolution counting circuit of a servo motor, which can divide pulses within operational frequency ranges of a position controller (not shown) connected to a counting circuit.

In order to attain the above-mentioned object, according to the present invention a revolution counting circuit of a servo motor is.

The circuit includes a pulse multiplying means for multiplying square pulses outputted from an encoder, the pulse multiplying means comprising a first exclusive OR gate connected respectively to pulse input channels of the encoder and a second exclusive OR gate connected to an output terminal of the first exclusive OR gate directly and through a delay circuit.

Also included is pulse dividing means for dividing multiplied pulses outputted from the pulse multiplying means by a divided value set by a microprocessor;

pulse selection means for selectively outputting one of the square pulses outputted from said pulse multiplying means and the pulse dividing means in accordance with the divided value set by the microprocessor; and a counter for down-counting and up-counting the square pulses outputted from said pulse selection means.

Further, the circuit includes waveform shaping means for outputting a pair of square pulses having a phase difference identical with respect to the pulses outputted from an encoder, the pulse shaping means comprising an third exclusive OR gate connected to the counter and first and second flip flops connected to the output terminals of the third exclusive OR gate and the counter; and control signal generating means for generating a control signal in accordance with a period of the pulses outputted from said encoder and the second exclusive OR gate and for supplying the control signal to the counter and the waveform shaping means.

BRIEF DESCRIPTION OF THE DRAWINGS

For a fuller understanding of the nature and objects of the present invention, reference should be made to the following detailed description taken in conjunction with the accompanying drawings in which:

FIG. 1 is a schematic diagram of a circuit for counting revolutions of a servo motor in accordance with the prior art;

FIG. 2 is a time chart indicating the signals at various points in the circuit shown in FIG. 1;

FIGS. 4A–4J are a time chart indicating the signals at various points in the circuit shown in FIG. 3.

DETAILED DESCRIPTION OF THE INVENTION

Figure 3:
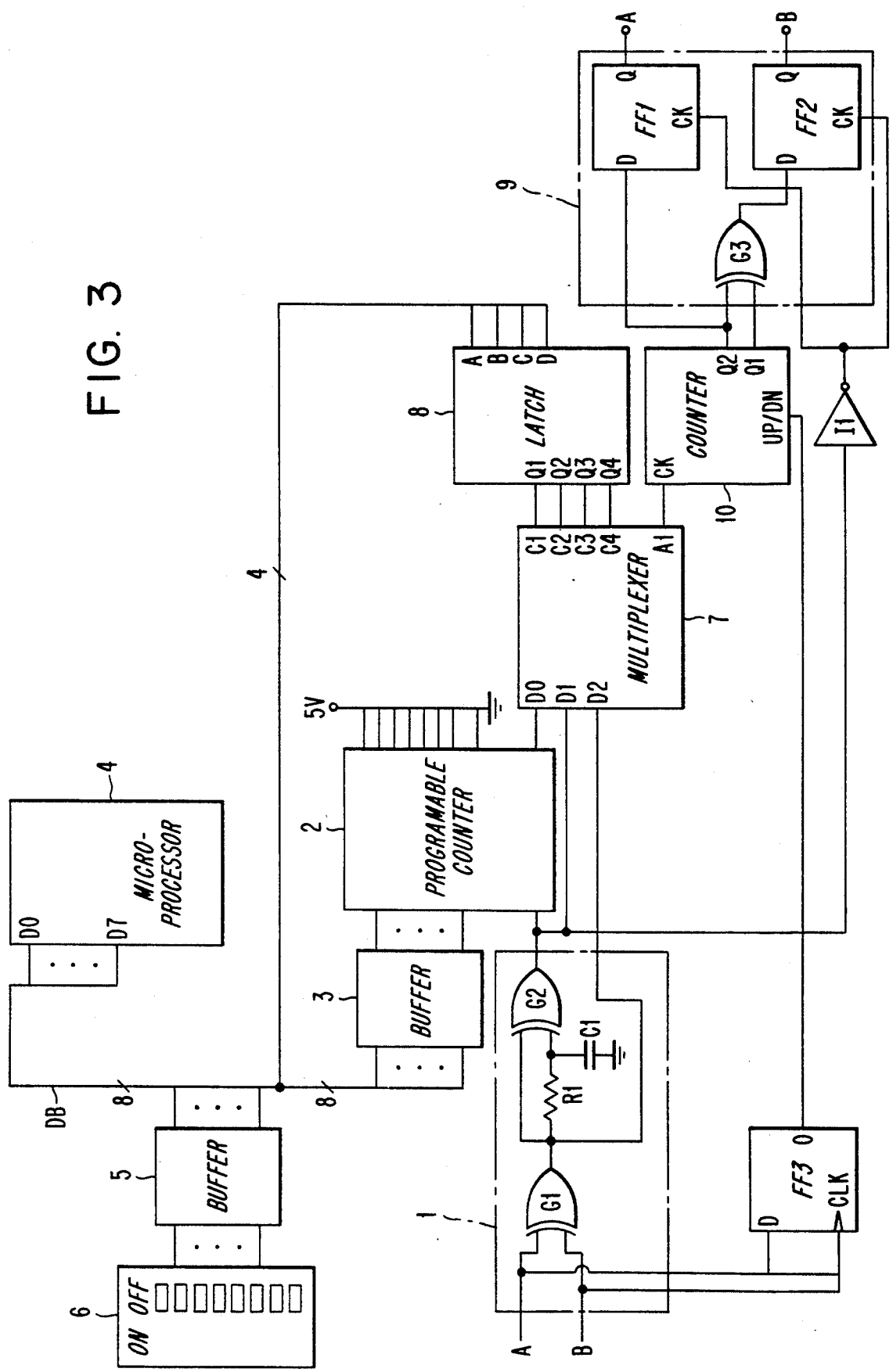
FIG. 3 is a schematic diagram of a circuit for counting the revolutions of a servo motor in accordance with an embodiment of the present invention.

A pulse multiplying circuit 1 in FIG. 3 including first and second exclusive OR gates G1, G2 performs an "exclusive OR" operation on a pair of pulses having different phases outputted from an encoder (not shown), and then multiplies the pulses four times.

In other words, the first exclusive OR gate G1 outputs square pulses corresponding to twice the encoder signal pulse frequency, namely, twice-multiplied pulses, by performing an "exclusive OR" operation on a pair of encoder signal pulses supplied to the pulse input channels A and B.

The twice-multiplied pulses are simultaneously inputted to a pair of input terminals of the second exclusive OR gate G2. One set of pulses is inputted in a delayed state to one input terminal through a delay circuit comprising a resistor R1 and a capacitor C1.

Accordingly, the second exclusive OR gate G2 outputs square pulses of fourfold frequency by performing an "exclusive OR" operation on the twice-multiplied square pulses and the delayed twice-multiplied square pulses.

Consequently, the pulse multiplying circuit 1 multiplies four times the square pulses inputted from the encoder.

A programmable counter 2 which can variably change a predetermined data value is connected to the output terminal of the second exclusive OR gate G2. The programmable counter 2 divides the square (signal) pulses outputted from said second exclusive OR gate G2 by a predetermined value.

A data input terminal of the programmable counter 2 is connected to a microprocessor 4 through a buffer 3 which performs buffering functions and a data bus DB. Data terminals D0–D7 of the microprocessor 4 are connected through a buffer 5 to a Dual In-line Package (DIP) switch 6 which is operated manually by the user.

Accordingly, the user manually operates the DIP switch 6 to input predetermined divisors into the microprocessor 4 which, according to inputted divisors, controls the programmable counter 2.

When an 8-bit DIP switch 6 is used as illustrated in FIG. 3, a maximum divisor up to 256 can be set variably, so that the programmable counter 2 can divide input pulses by up to 256. However the present invention is not confined to the 8-bit DIP switch and can be used with various kinds of DIP switches.

Square pulses divided at the programmable counter 2, square pulses multiplied at said second exclusive OR gate G2 and square pulses multiplied by said first exclusive OR gate G1 are respectively supplied to data input terminals D0, D1, D2 of a multiplexer 7.

The multiplexer 7 selectively outputs one of a plurality of the square pulses from an output terminal A1 thereof to the counter 10 according to a signal inputted from the microprocessor 4 through a latch circuit 8 to the signal input terminals C1–C4 of the multiplexer, thereof.

In other words, when a data value divided by more than 3 is set at the microprocessor 4 in order to divide the encoder signal pulses by more than 3, a signal 0011 which is 3 in binary notation, is inputted through a latch circuit 8 to control signal input terminals C1–C4 of the multiplexer 7, which outputs the square signal pulses divided by the programmable counter 2.

If the DIP switch 6 is set to correspond to 000 0010 binary notation in order to divide the encoder signal pulses by 2, a signal 0010 in binary notation corresponding to 2 in decimal notation is inputted to the control signal input terminals C1–C4 of the multiplexer 7, which outputs square pulses multiplied at second exclusive OR gate G2.

Furthermore, if the DIP switch 6 is set up to 0000 0000 of binary digit in order to output the encoder signal pulses intact without division, a signal 0001 is inputted to the control signal input terminals C1–C4 of said multiplexer 7, which outputs square pulses multiplied at said first exclusive OR gate G1.

The signal outputted from said multiplexer 7 is reconstructed as a pair of divided square pulses having the same phases as the signal pulses being outputted from the encoder at a waveform shaping means 9 and is outputted to the position controller (not shown).

In other words, the waveform shaping means 9 includes a counter 10, which up-counts or down-counts the divided signals outputted from the multiplexer 7 according to the direction of rotation of the servo motor (not shown). The signals outputted from said counter 10 are directly supplied to the flip flop FF1. The "exclusive OR" operation is performed on the signals, which are calculated at a third exclusive OR gate G3 for supply to the flip flop FF2.

The flip flops FF1 and FF2, according to control signals supplied from the control signal generating means connected to said first and second exclusive OR gates G1, G2, output to the position controller (not shown) a pair of divided square pulses having the same phase difference as a pair of signal pulses outputted from the encoder. The position controller, utilizing reconstructed and divided square signal pulses, controls the servo motor (not shown). In this location, the control signal generating means includes a flip flop FF3 and the inverter I1.

the following is an explanation about operations and effects of an embodiment in the present invention.

The square signal pulses illustrated in FIGS. 4A and 4B are inputted to signal input channels A, B of exclusive OR gate G1 illustrated in FIG. 3 from the encoder (not shown).

When a servo motor (not shown) not attached with the encoder rotates in the forward direction, a phase of a square pulse illustrated in FIG. 4A leads ahead of a phase of a pulse illustrated in FIG. 4B. When the servo motor rotates in the reverse direction, the opposite occurs. In other words, the phase of the pulse of FIG. 4A lags behind the phase of the pulse in FIG. 4B.

The exclusive OR gate G1 performs an "exclusive OR" operation on the pulses illustrated in FIG. 4A and FIG. 4B and outputs the twice-multiplied square signal pulses as in FIG. 4C to the exclusive OR gate G2. The exclusive OR gate G2 performs an "exclusive OR" operations on said twice-multiplied signal pulses and twice-multiplied signal pulses delayed at the resistor R1 and the capacitor C1, multiplies by four times the square signal pulses outputted from the encoder as illustrated in FIG. 4D, and outputs to the programmable counter 2 including the dividing means.

The programmable counter 2 divides the four times-multiplied signal pulses outputted from the exclusive OR gate G2 in accordance with a divisor N which the user has set for the microprocessor by manipulating the DIP switch 6.

The example in the present invention is a division corresponding to N=3 for easy understanding. The square signal pulses outputted from said exclusive OR gate G2 and divided by 3 are illustrated in FIG. 4E.

The square signal pulsed twice-multiplied at the exclusive OR gate G1, the signal pulses multiplied by four at exclusive OR gate G2 and the signal pulses divided by 3 at the programmable counter 2 are respectively supplied to the input terminals D2, D1, and D0 of the multiplexer 7, which selects one of the signal pulses and outputs the selected signal to an up/down counter 10 comprising wavefrom shaping means 9.

In order to help better understand the present invention, an example is discussed where the multiplexer 7 has selected the square signal pulses divided by 3 and outputted from the programmable counter 2.

The up/down counter 10 performs up-count operations when a high level signal is outputted from the flip flop FF3 connected to the signal input terminal of said exclusive OR gate G1 by the forward rotation of the servo motor. When the servo motor rotates in the reverse direction, a low level signal is outputted from said flip flop FF3 for down-count operations.

The explanation provided below is directed to up-count operations. Down-count operations are correspondingly similar.

When the square signal pulses illustrated in FIG. 4E are up-counted by said up/down counter 10, the signal pulses shown in FIG. 4F and FIG. 4G are outputted from the output terminals Q1, Q2 or said up/down counter 10.

The exclusive OR gate G3 performs an "exclusive OR" operation on the signal pulses, and then outputs the pulses shown in FIG. 4H into a terminal D of the flip flop FF2. The signal pulses outputted from the output terminal Q2 are directly inputted into the D terminal of flip flop FF1.

The flip flops FF1, FF2 output square pulses respectively depicted in FIGS. 4I, 4J according to the signal pulses to be supplied to the clock terminal thereof from said exclusive OR gate G2 through the inverter I1. The pulses shown in FIGS. 4I and 4J are supplied to the position controller (not shown) connected to the output terminals of the flip flops FF1, FF2 to thereby control the servo motor.

As depicted in the foregoing, the present invention can divide selectively the signal pulses outputted from the encoder according to the divisors which the user has established by utilizing the DIP switch, and in some cases, can output signal pulses of the encoder intact without dividing the signal pulses.

The present invention can be adapted for use as a revolution counting circuit for any position controller regardless of the type or location of the position controllers which detect a present displacement value of a servo motor. This is accomplished by utilizing square signal pulses of an encoder such that the signal pulses of the encoder can be divided into pulses having desired frequencies and then can be outputted thereafter.

What is claimed is:

1. An apparatus for counting a number of revolutions of a servo motor, said apparatus comprising:
    first means for receiving a first square wave signal having a first frequency and a second square wave signal having said first frequency and out of phase from said first square wave signal by a phase difference, and for generating a first output signal having a second frequency which is an integral multiple of said first frequency;
    second means for receiving said first output signal and for generating a second output signal having a third frequency equal to said second frequency divided by a predetermined integral divisor;
    third means for receiving said first output signal and said second output signal and for selectively outputting one of said first output signal and said second output signal as a count input signal;
    fourth means for receiving said count input signal, for counting a number of pulses in said count input signal, and for generating a count output signal indicative of said number of pulses; and
    fifth means for receiving said count output signal and for generating a third square wave signal and a fourth square wave signal out of phase from said third square wave signal by said phase difference, said third square wave signal and said fourth square wave signal being control signals for said servo motor.

2. The apparatus of claim 1 wherein said second means includes a programmable counter.

3. The apparatus of claim 1 wherein said third means includes a multiplexer.

4. The apparatus of claim 1 wherein said first means includes a first exclusive OR gate which receives and multiplies said first square wave signal and said second square wave signal, and a second exclusive OR gate connected to said first exclusive OR gate directly and through a delay circuit.

5. The apparatus of claim 1 wherein said fifth means includes an exclusive OR gate and first and second flip flops connected to said exclusive OR gate and said fourth means.

6. A method of counting a number of revolutions of a servo motor, said method comprising the steps of:

receiving a first square wave signal having a first frequency and a second square wave signal having said first frequency and out of phase from said first square wave signal by a phase difference;

generating a first output signal having a second frequency which is an integral multiple of said first frequency;

generating a second output signal having a third frequency equal to said second frequency divided by a predetermined integral divisor;

selectively outputting one of said first output signal and said second output signal as a count input signal;

counting a number of pulses in said count input signal;

generating a count output signal indicative of said number of pulses; and generating a third square wave signal and a fourth square wave signal out of phase from said third square wave signal by said phase difference, said third square wave signal and said fourth square wave signal being control signals for said servo motor.

* * * * *